(12) United States Patent
Chandolu et al.

(10) Patent No.: US 9,397,078 B1
(45) Date of Patent: Jul. 19, 2016

(54) SEMICONDUCTOR DEVICE ASSEMBLY WITH UNDERFILL CONTAINMENT CAVITY

(71) Applicant: Micron Technology, Inc., Boise, ID (US)

(72) Inventors: Anilkumar Chandolu, Boise, ID (US); Wayne H. Huang, Boise, ID (US); Sameer S. Vadhavkar, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/635,888

(22) Filed: Mar. 2, 2015

(51) Int. Cl.
*H01L 25/18* (2006.01)
*H01L 23/367* (2006.01)
*H01L 25/00* (2006.01)
*H01L 23/48* (2006.01)
*H01L 25/065* (2006.01)
*H01L 21/56* (2006.01)
*H01L 23/31* (2006.01)

(52) U.S. Cl.
CPC .............. *H01L 25/18* (2013.01); *H01L 21/563* (2013.01); *H01L 23/3142* (2013.01); *H01L 23/3675* (2013.01); *H01L 23/481* (2013.01); *H01L 25/0657* (2013.01); *H01L 25/50* (2013.01); *H01L 2225/06541* (2013.01); *H01L 2225/06548* (2013.01); *H01L 2225/06555* (2013.01); *H01L 2225/06589* (2013.01)

(58) Field of Classification Search
None
See application file for complete search history.

(56) References Cited

U.S. PATENT DOCUMENTS

| | | | |
|---|---|---|---|
| 7,332,820 B2* | 2/2008 | Tan | H01L 23/3128 257/777 |
| 2012/0049354 A1* | 3/2012 | Sawayama | H01L 21/561 257/737 |
| 2013/0119528 A1* | 5/2013 | Groothuis | H01L 23/36 257/690 |
| 2015/0069624 A1* | 3/2015 | Pham | H01L 25/0652 257/774 |
| 2015/0333048 A1* | 11/2015 | Yamamichi | H01L 23/49838 257/774 |

* cited by examiner

*Primary Examiner* — Joseph Schoenholtz
(74) *Attorney, Agent, or Firm* — Perkins Coie LLP

(57) ABSTRACT

Semiconductor device assemblies with underfill containment cavities are disclosed herein. In one embodiment, a semiconductor device assembly can include a first semiconductor die having a base region formed from a substrate material, a recessed surface along the base region, a peripheral region formed from the substrate material and projecting from the base region, and a sidewall surface along the peripheral region and defining a cavity with the sidewall surface in the peripheral region. The semiconductor device assembly further includes a thermal transfer structure attached to the peripheral region of the first die adjacent the cavity, and an underfill material at least partially filling the cavity and including a fillet between the peripheral region and the stack of second semiconductor dies.

36 Claims, 10 Drawing Sheets

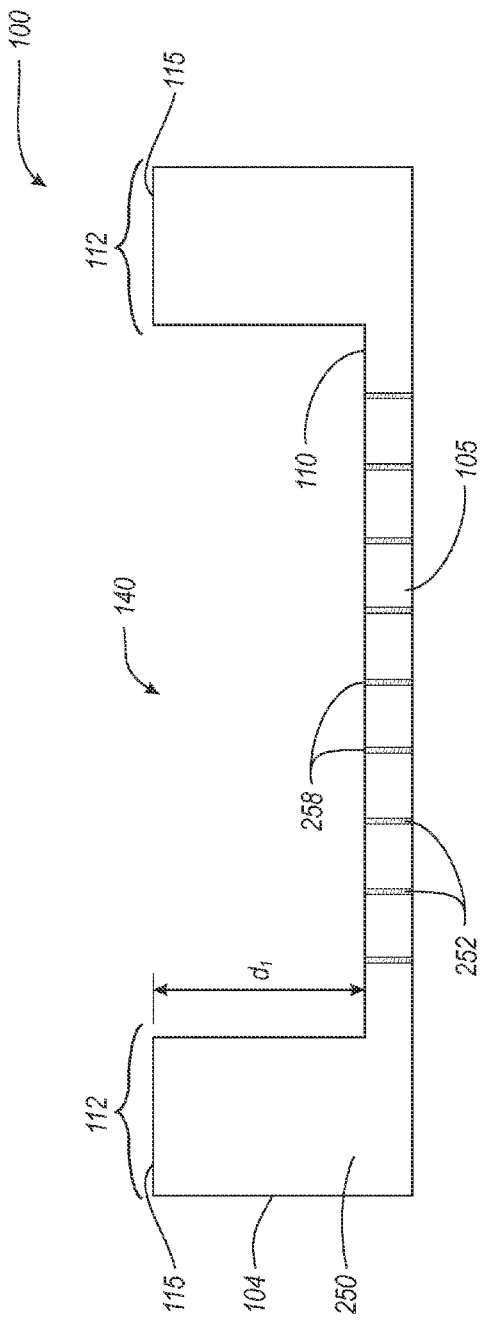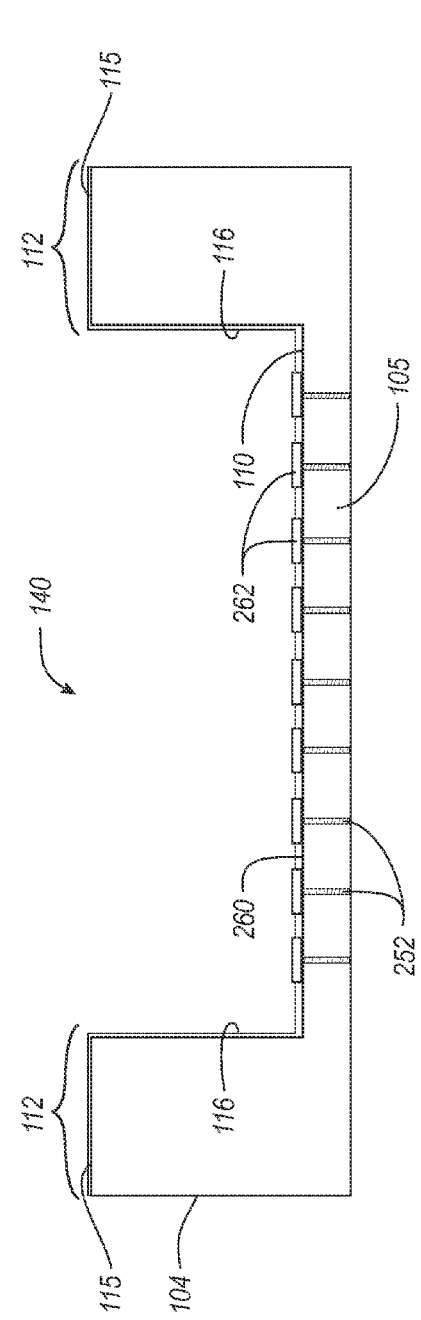

SEMICONDUCTOR DEVICE ASSEMBLY WITH UNDERFILL CONTAINMENT CAVITY

TECHNICAL FIELD

The disclosed embodiments relate to semiconductor device assemblies, and in particular to semiconductor device assemblies with underfill containment cavities.

BACKGROUND

Packaged semiconductor dies, including memory chips, microprocessor chips, and imager chips, typically include a semiconductor die mounted on a substrate and encased in a plastic protective covering. The die includes functional features, such as memory cells, processor circuits, and imager devices, as well as bond pads electrically connected to the functional features. The bond pads can be electrically connected to terminals outside the protective covering to allow the die to be connected to higher level circuitry.

Semiconductor manufacturers continually reduce the size of die packages to fit within the space constraints of electronic devices, while also increasing the functional capacity of each package to meet operating parameters. One approach for increasing the processing power of a semiconductor package without substantially increasing the surface area covered by the package (i.e., the package's "footprint") is to vertically stack multiple semiconductor dies on top of one another in a single package. The dies in such vertically-stacked packages can be interconnected by electrically coupling the bond pads of the individual dies with the bond pads of adjacent dies using through-silicon vias (TSVs).

In vertically stacked packages, the heat generated is difficult to dissipate, which increases the operating temperatures of the individual dies, the junctions therebetween, and the package as a whole. This can cause the stacked dies to reach temperatures above their maximum operating temperatures ($T_{max}$) in many types of devices.

BRIEF DESCRIPTION OF THE DRAWINGS

FIGS. 2A-2D are cross-sectional views illustrating a method of manufacturing a semiconductor device assembly in accordance with embodiments of the present technology.

DETAILED DESCRIPTION

Specific details of several embodiments of stacked semiconductor die assemblies with an underfill containment cavity or related dam feature configured to contain excess underfill material are described below. The term "semiconductor device" generally refers to a solid-state device that includes semiconductor material. A semiconductor device can include, for example, a semiconductor substrate, wafer, or die that is singulated from a wafer or substrate. Throughout the disclosure, semiconductor devices are generally described in the context of semiconductor dies; however, semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing. The term "semiconductor device assembly" can refer to an assembly of one or more semiconductor devices, semiconductor device packages, and/or substrates (e.g., interposer, support, or other suitable substrates).

As used herein, the terms "vertical," "lateral," "upper," and "lower" can refer to relative directions or positions of features in the semiconductor device in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 1:
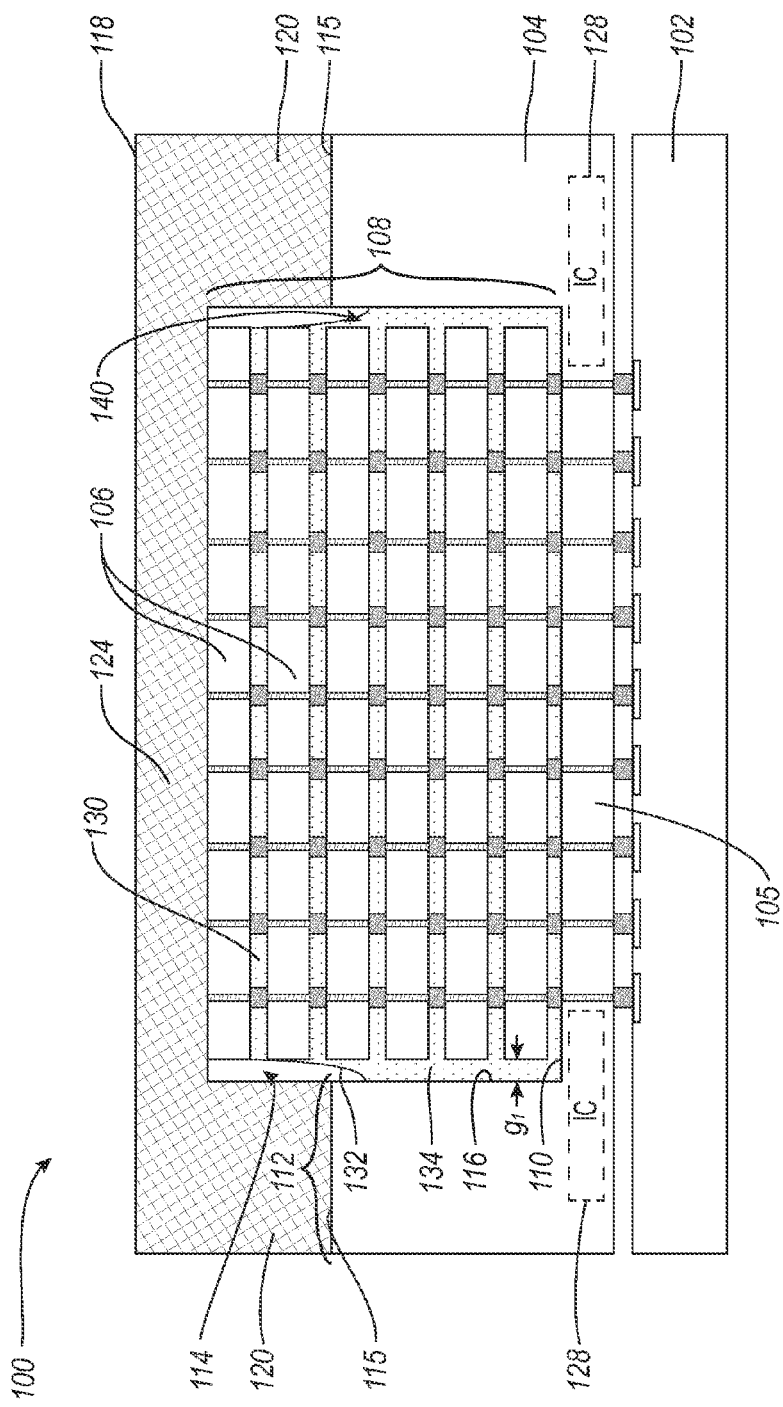
FIG. 1 is a cross-sectional view of a semiconductor device assembly in accordance with embodiments of the present technology.

FIG. 1 is a cross-sectional view of a semiconductor device assembly 100 ("assembly 100") configured in accordance with an embodiment of the present technology. As shown, the assembly 100 includes a package support substrate 102, a first semiconductor die 104 on the substrate 102, a thermal transfer structure, or casing 118, attached to the first die 104, and a plurality of second semiconductor dies 106 mounted to the first die 104. The first die 104 includes a base region 105 having a recessed surface 110, a peripheral region 112 (known to those skilled in the art as a "porch" or "shelf") projecting away from the base region 105 and having a top surface 115 and a sidewall surface 116 along the interior of the peripheral region 112. The recessed surface 110 and the sidewall surface 116 define an underfill containment cavity 140 within the peripheral region 112. The second dies 106 are arranged in a stack 108 ("die stack 108") on the recessed surface 110 of the cavity 140 and separated from the sidewall surface 116 by a gap $g_1$. In the embodiment shown in FIG. 1, the casing 118 includes a first wall portion 120 attached to the peripheral region 112, and a second wall portion 124 extending laterally above the die stack 108. The first and second wall portions 120 and 124 define a recess 114 above the cavity 140 that contains a portion of the die stack 108. In other embodiments, the peripheral region 112 of the first semiconductor die 104 can extend to an elevation at or above the uppermost second die 106, and the casing 118 can be a single panel without the first wall portion 120. In at least some embodiments, the casing 118 is configured to absorb and dissipate thermal energy away from the first die 104 generally at the first wall portion 120, and from the die stack 108 generally at the second wall portion 124.

The first and second dies 104 and 106 can include various types of semiconductor components and functional features, such as dynamic random-access memory (DRAM), static random-access memory (SRAM), flash memory, other forms of integrated circuit memory, processing circuits, imaging components, and/or other semiconductor features. In various embodiments, for example, the assembly 100 can be configured as a hybrid memory cube (HMC) in which the stacked second dies 106 are DRAM dies or other memory dies that provide data storage and the first die 104 is a high-speed logic die that provides memory control (e.g., DRAM control) within the HMC. In the embodiment illustrated in FIG. 1, the first die 104 includes an integrated circuit 128 that extends at least partially into the peripheral region 112. In one embodiment, the portion of the integrated circuit 128 that extends into the peripheral region 112 can include one or more circuit components that produce relatively large amounts of heat during operation, such as serial/deserializer (SERDES) circuits. In other embodiments, the first and second dies 104 and 106 may include other semiconductor components and/or the semiconductor components of the individual second dies 106 in the die stack 108 may differ.

The assembly 100 further includes an underfill material 130 between each of the second dies 106 and between the first die 104 and the bottom second die 106. The underfill material 130 can include an excess portion 134 that extends into the gap $g_1$ between the die stack 108 and the sidewall surface 116. The excess portion 134 at least partially covers the sidewall surface 116, and includes a fillet 132. As described in greater detail below, the gap $g_1$ between the sidewall surface 116 and the die stack 108 can be sized to prevent or inhibit the spread of the excess underfill material 134 onto the peripheral region 112 during deposition of the underfill material 130. In other devices that attach a thermally conductive member to the peripheral region or porch of an underlying die, the underfill material usually spreads laterally over the peripheral region. In general, underfill materials are usually poor thermal conductors compared to a thermally conductive member (e.g., the casing 118 or the substrate material of the first semiconductor die 104), and as such, underfill material between the peripheral region and the conductive member in such devices can increase thermal resistance. Additionally, the fillet of the underfill material in such devices creates a large spacing between the conductive member and the peripheral region that reduces the coverage area of the conductive member on the peripheral region.

Several embodiments of the assembly 100 shown in FIG. 1 can accordingly provide enhanced thermal properties that lower the operating temperatures of the individual dies 104, 106 in the assembly 100 such that they stay below their designated maximum temperatures ($T_{max}$). This can be very useful when the assembly 100 is arranged as HMC because the first die 104 is usually a logic die and the second dies 106 are generally memory dies, and logic dies typically operate at a much higher power level than memory dies (e.g., 5.24 W compared to 0.628 W). Additionally, the integrated circuit 128 (e.g., a SERDES circuit) in the peripheral region 112 generally has a higher power density than the integrated circuit components in the portion of the logic die beneath the memory dies, which results in higher temperatures at the peripheral region. As such, by containing the underfill material 130 within the cavity 140, the amount of thermal transfer between the peripheral region 112 and the first wall portion 120 of the casing 128 can be improved.

Figure 2A:
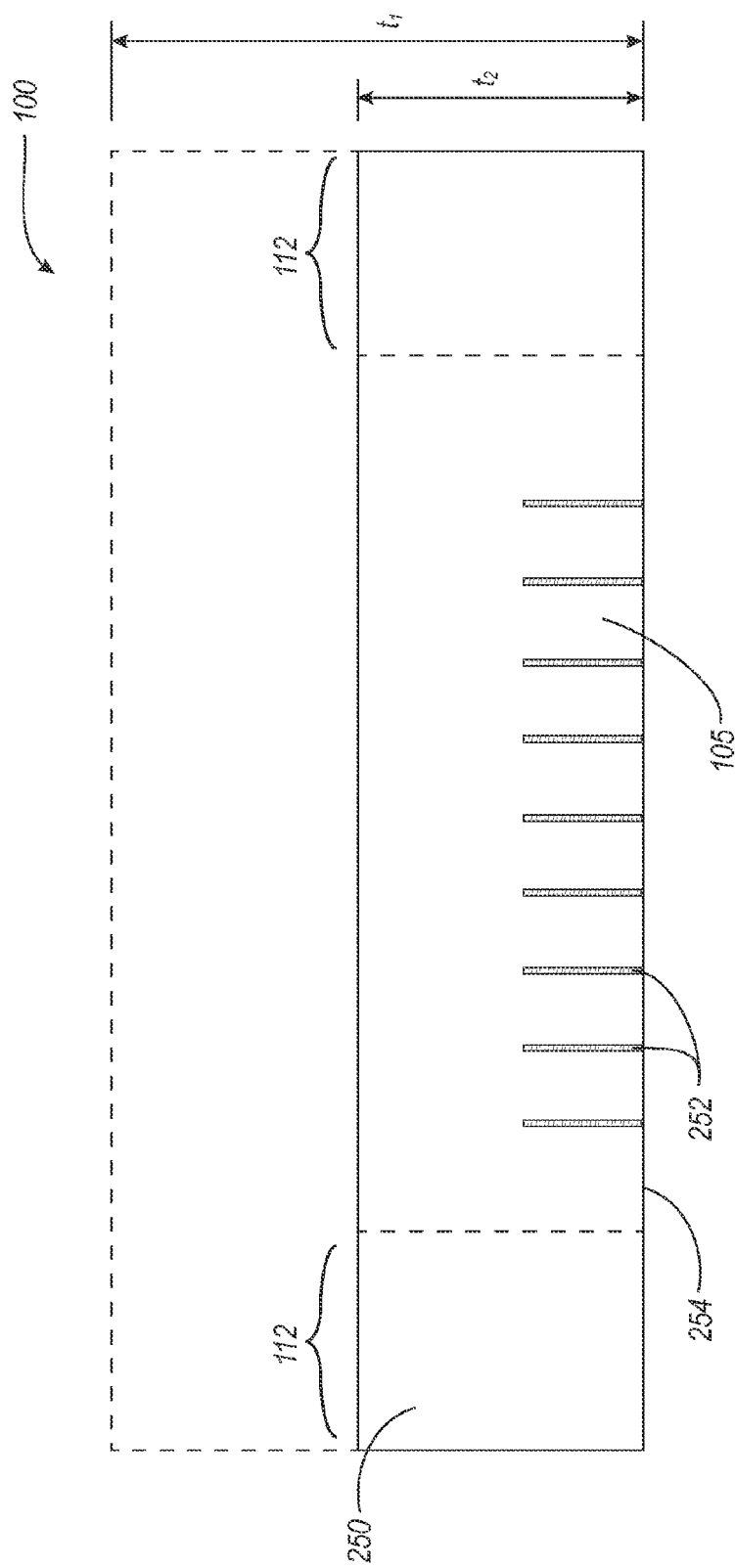

FIGS. 2A-2H illustrate aspects of a method of manufacturing the assembly 100 in accordance with embodiments of the present technology. FIG. 2A is a cross-sectional view of a stage of manufacturing the assembly 100. As shown, the first die 104 (FIG. 1) can be formed from a semiconductor substrate 250 (e.g., a silicon wafer) that has been thinned via, e.g., backgrinding, from a first thickness $t_1$ to a second thickness $t_2$. The second thickness $t_2$ generally defines the thickness of the peripheral region 112 (FIG. 1). One advantage of a thick peripheral region 112 is that it can improve heat dissipation at the periphery of the first die 104. Additionally, a thick peripheral region 112 can reduce die warp. In one embodiment, the second thickness $t_2$ can be about 300 µm. In other embodiments, the second thickness $t_2$ can be less than 300 µm (e.g., about 200 µm) or greater than 300 µm (e.g., about 500 µm).

As further shown in FIG. 2A, the substrate 250 can include a plurality of through-silicon vias (TSVs) 252 extending partially into a front-side surface 254 of the substrate at the base region 105. The TSVs 252 can be formed at a previous manufacturing stage by etching a plurality of holes in the front-side surface 254, and then filling the holes with a conductive material (e.g., copper or copper alloy). Each TSV 252 can include an electrically conductive material (e.g., copper) and an electrically insulative material (not shown) surrounding the electrically conductive material to electrically isolate the TSVs 252 from the surrounding substrate 250.

FIG. 2B is a cross-sectional view illustrating a subsequent stage of a method for manufacturing the assembly 100 after a depression has been etched in the substrate 250 to form the sidewalls 116 and the recessed surface 110 that define the cavity 140 within the peripheral region 112 and over the base region 105. The depression can be formed by patterning a layer of resist material (not shown) and using a wet or dry etching process. The peripheral region 112 and the base region 105 are accordingly integral regions of the material of the substrate 250. For example, the peripheral region and the base region can both include silicon. In the embodiment shown in FIG. 2B, a depth $d_1$ of the cavity 140 is selected such that surfaces 258 of the TSVs 252 are exposed at the recessed surface 110 of the cavity 140. In at least some embodiments, the cavity depth $d_1$ can be in a range of from about 50 µm to about 200 µm (e.g., 100 µm). In another embodiment, the cavity depth $d_1$ can be at least 200 µm. In yet another embodiment, the cavity depth $d_1$ can be at least 300 µm.

In at least some embodiments, the cavity depth $d_1$ can be selected based on the number of second dies 106 (FIG. 1) that are to be positioned with the cavity 140 and/or the thickness of the second dies 106. In several embodiments the second dies 106 have a thickness in a range of about 50 to about 200 µm (e.g., 60 µm). In one embodiment, an entire stack of semiconductor dies (e.g., a stack of three, four, six, eight, twelve, twenty or more dies) can be positioned in the cavity 140. In another embodiment, only a portion of the die stack 108 is positioned in the cavity 140 such that one or more of the upper semiconductor dies are positioned above the top of the cavity 140. For example, half of the die stack, more than half the stack, less than half the stack, or only a single die of the stack may be positioned in the cavity 140. Further, a width, length, and/or shape of the cavity 140 can be selected based on the size (e.g., the footprint of the die stack 108) and/or shape of the die stack 108. In one embodiment, the cavity 140 and the die stack 108 have similar planform shapes (e.g., square or rectangular shapes).

FIG. 2C is a cross-sectional view illustrating a subsequent stage of a method for manufacturing the assembly 100 after a dielectric material 260 has been deposited on the top surface 115 of the peripheral region 112 and the recessed surface 110 of the base region 105, and also after first bond pads 262 have been formed on the TSVs 252 at the base region 105. The dielectric material 260 can include, for example, a conformal film (e.g., a silicon oxide film) that covers the recessed surface 110 at the base of the cavity 140. The first bond pads 262 can be formed by patterning the dielectric material 260 to expose the TSVs 252, and then electroplating a conductive material (e.g., copper) onto the exposed TSVs 252.

Figure 2D:
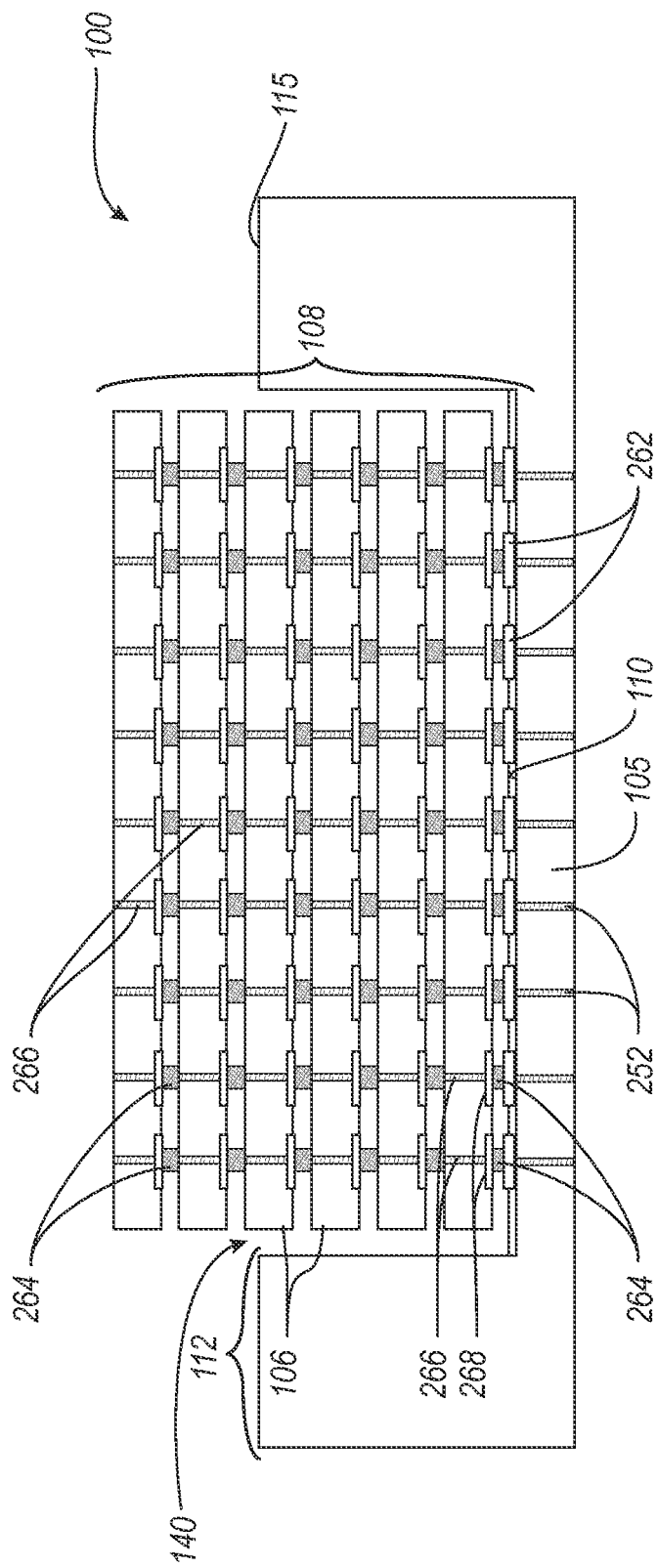

FIG. 2D is a cross-sectional view illustrating a subsequent stage of a method for manufacturing the assembly 100 after the die stack 108 has been positioned on the bond pads 262 at the recessed surface 110. As shown in FIG. 2D, the bottom second die 106 includes second bond pads 268, and a plurality of electrically conductive elements 264 connect the second bond pads 268 to corresponding first bond pads 262 of the first die 104. The second bond pads 268, in turn, can be coupled to TSVs 266 that extend through the bottom second die 106, and the TSVs 266 can be coupled to additional conductive elements 264, bond pads 268, and TSVs 266 at each level of the die stack 108. The electrically conductive elements 264 can have various suitable structures, such as pillars, columns, studs, bumps, and can be made from copper, nickel, solder (e.g., SnAg-based solder). Beyond electrical communication, the electrically conductive elements 264 and the TSVs 252, 266 can provide thermal conduits through which heat can be transferred away from the first and second dies 104 and 106.

Figure 2E:
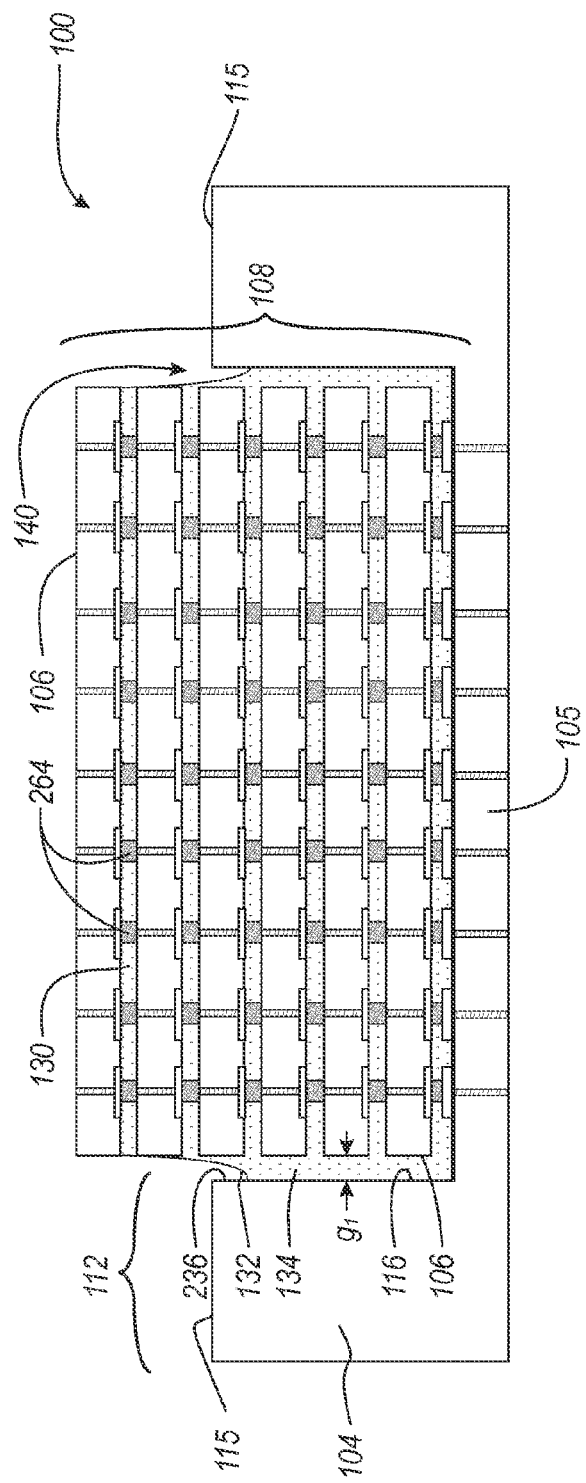
FIG. 2E is a cross-sectional view and FIG. 2F is a top plan view illustrating a method of manufacturing a semiconductor device assembly in accordance with embodiments of the present technology.
Figure 2F:
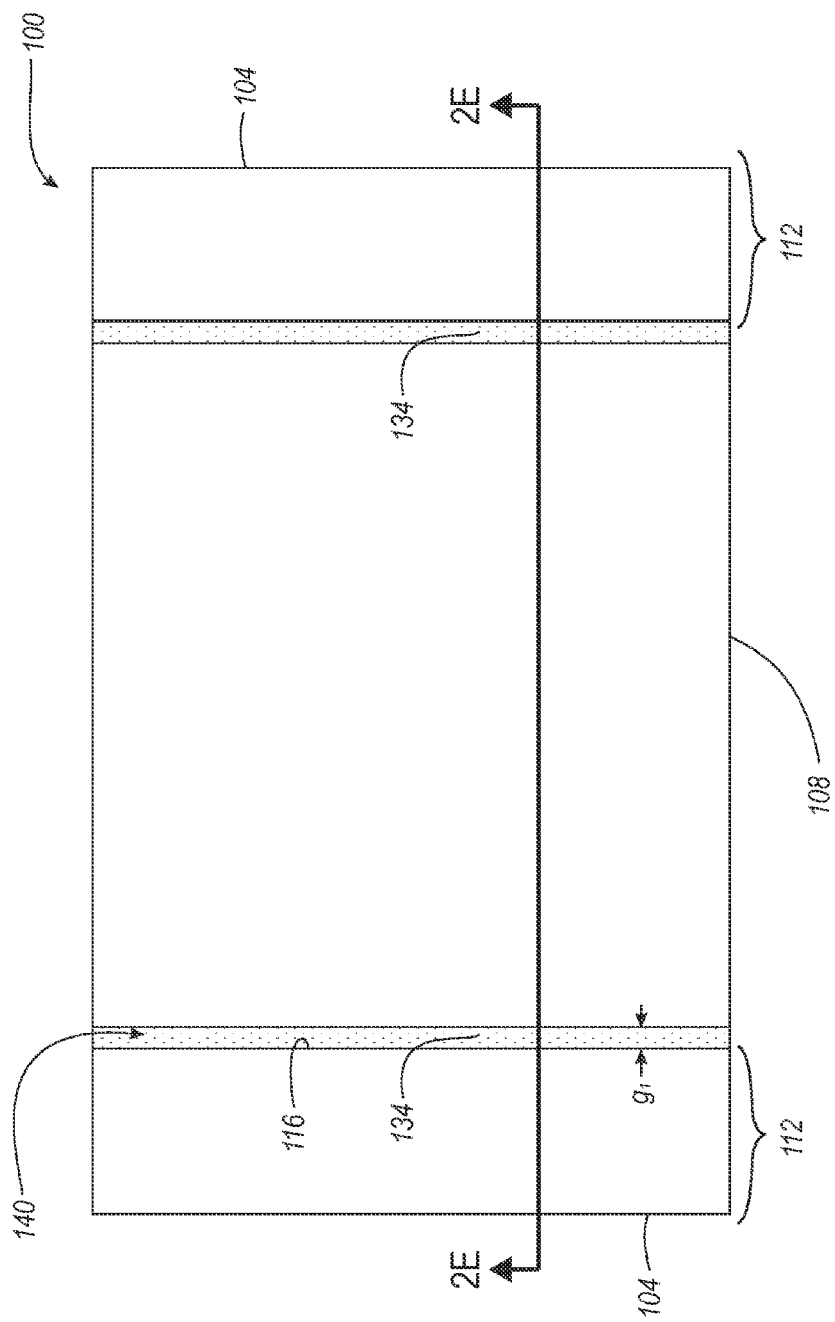

FIG. 2E is a cross-sectional view and FIG. 2F is a top view illustrating another stage of the method of manufacturing the assembly 100 after the underfill material 130 has been deposited between the second dies 106 and between the first die 104 and the bottom second die 106. Referring to FIGS. 2E and 2F together, the underfill material 130 is typically a flowable material that fills the interstitial spaces between the second dies 106 and the electrically conductive elements 264. In one embodiment, the underfill material 130 can be injected into the interstitial spaces by micro jetting the underfill material between the individual second dies 106. The volume of underfill material 130 is selected to adequately fill the interstitial spaces such that excess underfill material 134 goes into the gap $g_1$ between the sidewall surface 116 and the die stack 108 to form the fillet 132. The size of the gap $g_1$ and/or the cavity depth $d_1$ can be selected to prevent or inhibit the excess underfill material 134 from flowing onto the top surface 115 of the peripheral region 112 and to accommodate the fillet 132 of underfill material 130. In certain embodiments, a portion 236 of the sidewall surface 116 may be exposed in cases where the underfill material 130 does not completely fill the gap $g_1$. In at least some embodiments, the underfill material 130 can be a non-conductive epoxy paste (e.g., XS8448-171 manufactured by Namics Corporation of Niigata, Japan), a capillary underfill, a non-conductive film, a molded underfill, and/or include other suitable electrically-insulative materials. The underfill material 130 can alternatively be a dielectric underfill, such as FP4585 manufactured by Henkel of Düsseldorf, Germany. In some embodiments, the underfill material 130 can be selected based on its thermal conductivity to enhance heat dissipation through the die stack 108.

Figure 2G:
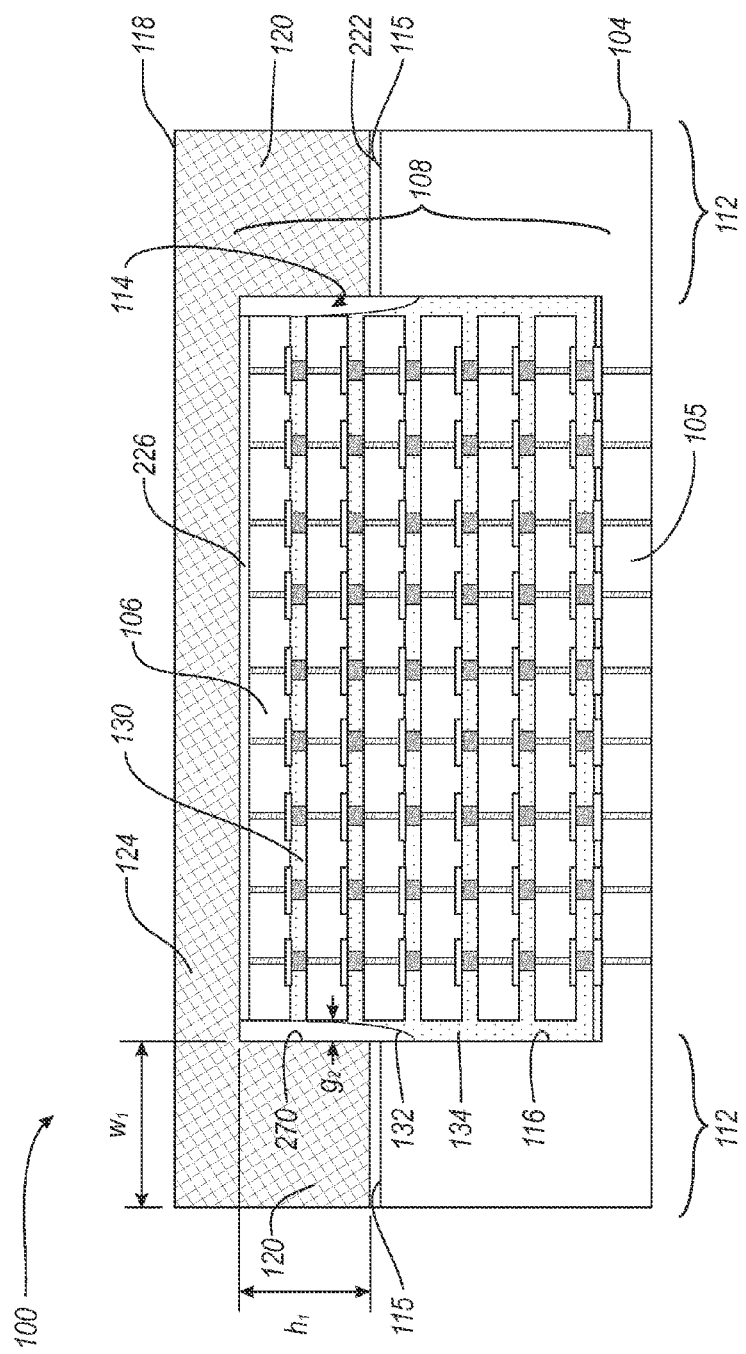
FIG. 2G is a cross-sectional view and FIG. 2H is a top plan view illustrating a method of manufacturing a semiconductor device assembly in accordance with embodiments of the present technology.
Figure 2H:
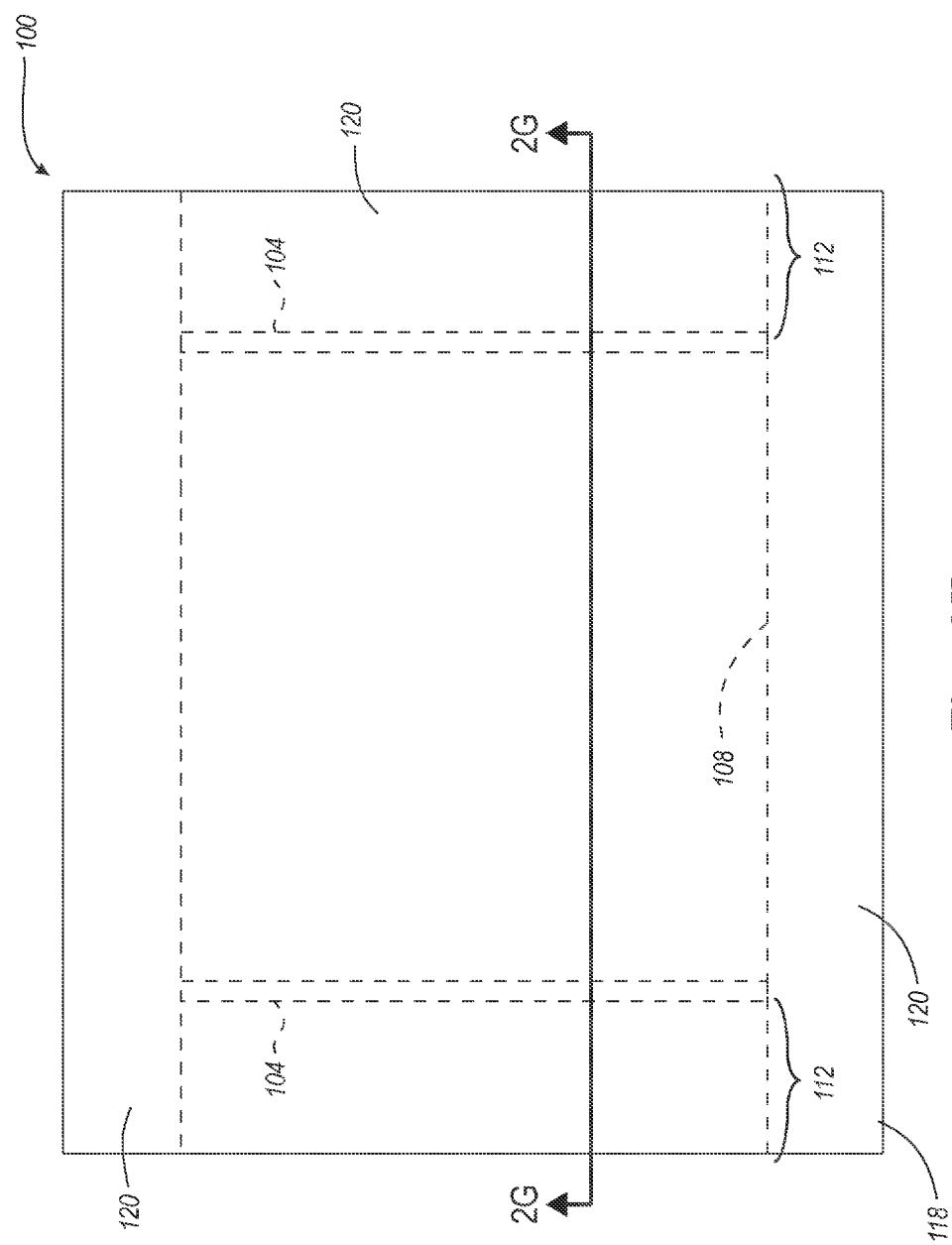

FIG. 2G is a cross-sectional view and FIG. 2H is a top view illustrating another stage of the method of manufacturing the assembly 100 after the casing 118 has been attached to the peripheral region 112 of the first die 104. Referring first to FIG. 2G, the first wall portion 120 of the casing 118 is attached to the top surface 115 of the peripheral region 112 by a first adhesive 222, and the second wall portion 124 of the casing 118 is attached to the top second die 106 by a second adhesive 226. The adhesives 222 and 226 can be the same adhesive, or they can be different from each other. The first and second adhesives 222 and 226 can be, for example, thermal interface materials ("TIMs") or another suitable adhesive. For example, TIMs and other adhesives can include silicone-based greases, gels, or adhesives that are doped with conductive materials (e.g., carbon nano-tubes, solder materials, diamond-like carbon (DLC), etc.), as well as phase-change materials. In several embodiments, the casing 118 is made from a thermally conductive material, such as nickel, copper, aluminum, ceramic materials with high thermal conductivities (e.g., aluminum nitride), and/or other suitable thermally conductive materials.

In the illustrated embodiment, the recess 114 of the casing 118 has a shape that conforms to the shape of the die stack 108. In such cases the recess 114 has a height $h_1$ that is selected based on the number of second dies 106 that are to be positioned in the casing 118 and the first wall portion 120 is spaced apart from the die stack 108 by a gap $g_2$ configured to provide sufficient space between the die stack 108 and an inner surface 270 of the first wall portion 120 and to accommodate the fillet 132. In one embodiment, the casing 118 does not contact the underfill material 130. In at least some embodiments, a width $w_1$ of the first wall portion 120 can be selected such that the first wall portion covers a significant percentage of the peripheral region 112. In these and other embodiments, the inner surface 270 of the first wall portion 120 can be substantially coplanar with the sidewall surface 116. Referring to FIG. 2H, the first wall portion 120 can be configured to extend around at least a portion of the die stack 108. In other embodiments, the casing 118 is not configured to conform to the shape of the die stack 108.

Figure 3:
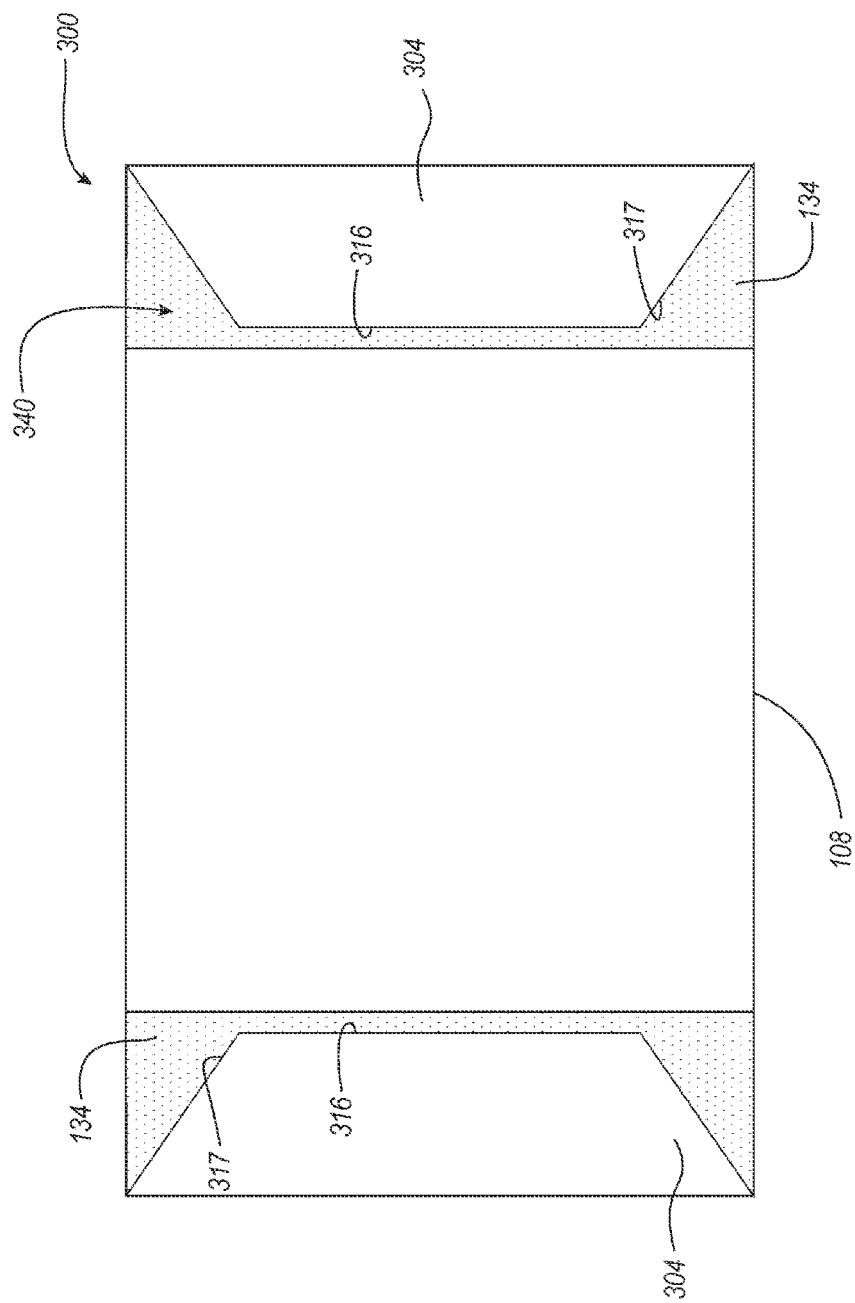
FIG. 3 is a top plan view of a semiconductor device assembly in accordance with embodiments of the present technology.

FIG. 3 is a cross-sectional, top view of another embodiment of a semiconductor device assembly 300 ("assembly 300") in accordance with embodiments of the present technology. Several features of the assembly 300 are similar to those described above with respect to the assembly 100. For example, the assembly 300 can include the die stack 108 of second semiconductor dies positioned in a cavity 340 of a first semiconductor die 304. In the embodiment illustrated in FIG. 3, however, the first die 304 includes a first sidewall surface 316 facing the die stack 108, and a second sidewall surface 317 angled away from the first sidewall surface 316. The excess underfill material 134 at least partially covers the first and second sidewall surfaces 316 and 317. In one aspect of the embodiment illustrated in FIG. 3, the second sidewall 317 can increase the volume of the cavity 340 to contain more of the excess underfill material 134 compared to the cavity 140 shown in FIG. 1. In a related embodiment, the second sidewall 317 can be used to increase the volume of the cavity 340 without increasing the cavity depth $d_1$ (FIG. 2B).

Figure 4:
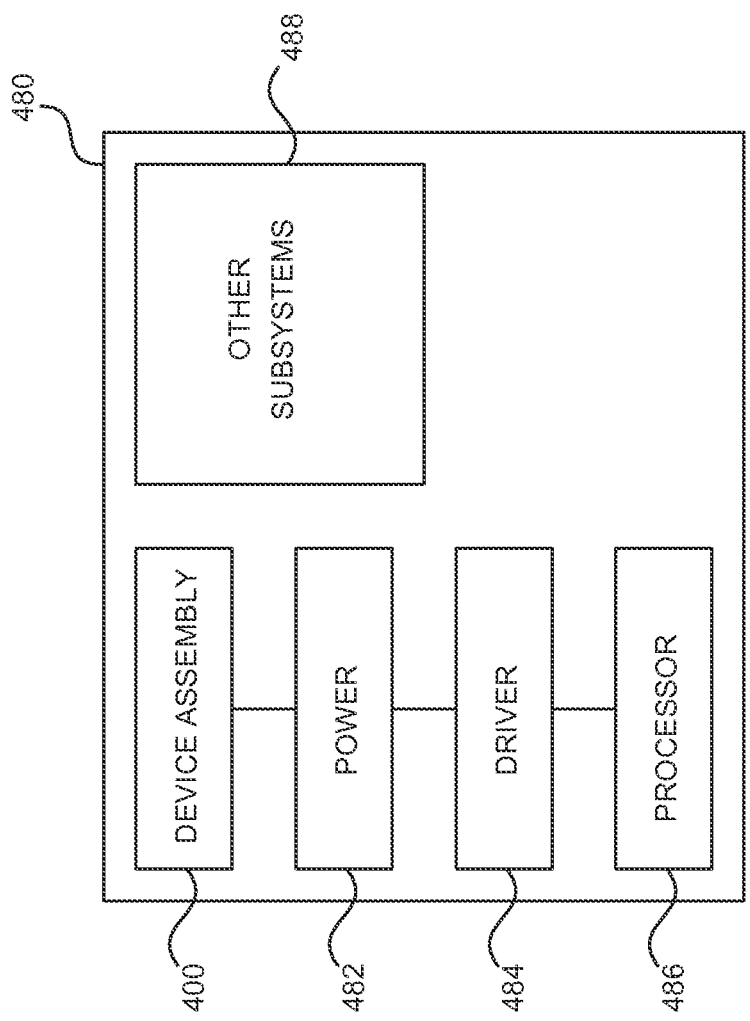
FIG. 4 is a schematic view of a system that includes a semiconductor device in accordance with embodiments of the present technology.

Any one of the stacked semiconductor device assemblies described above with reference to FIGS. 1-3 can be incorporated into any of a myriad of larger and/or more complex systems, a representative example of which is system 480 shown schematically in FIG. 4. The system 480 can include a semiconductor device assembly 400, a power source 482, a driver 484, a processor 486, and/or other subsystems or components 488. The semiconductor device assembly 400 can include features generally similar to those of the semiconductor device assemblies described above with reference to FIGS. 1-3, and can therefore include various features that enhance heat dissipation. The resulting system 480 can perform any of a wide variety of functions, such as memory storage, data processing, and/or other suitable functions. Accordingly, representative systems 480 can include, without limitation, hand-held devices (e.g., mobile phones, tablets, digital readers, and digital audio players), computers, vehicles, appliances and other products. Components of the system 480 may be housed in a single unit or distributed over multiple, interconnected units (e.g., through a communications network). The components of the system 480 can also include remote devices and any of a wide variety of computer readable media.

From the foregoing, it will be appreciated that specific embodiments of the technology have been described herein for purposes of illustration, but that various modifications may be made without deviating from the disclosure. For example, in one embodiment, the underfill containment cavity 140 can be positioned off center, and the peripheral region 112 on one side of the cavity may be larger than the peripheral region on the other. Further, although many of the embodiments of the semiconductor dies assemblies are described with respect to HMCs, in other embodiments the semiconductor die assemblies can be configured as other memory devices or other types of stacked die assemblies. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A semiconductor device assembly, comprising:
   a first semiconductor die having a base region formed from a substrate material, a recessed surface along the base region, a peripheral region formed from the substrate material and projecting from the base region, and a sidewall surface along the peripheral region, and wherein the recessed surface and the sidewall surface define a cavity within the peripheral region;
   a stack of second semiconductor dies at least partially in the cavity;
   a thermal transfer structure attached to the peripheral region of the first semiconductor die; and
   an underfill material at least partially filling the cavity and including a fillet between the peripheral region and the stack of second semiconductor dies.

2. The semiconductor device assembly of claim 1 wherein:
   the sidewall surface faces inwardly toward the stack of second semiconductor dies; and
   the sidewall surface includes a portion that is exposed.

3. The semiconductor device assembly of claim 2 wherein the fillet includes a first portion between the sidewall surface and the stack of second semiconductor dies, and a second portion between the thermal transfer structure and the stack of second semiconductor dies.

4. The semiconductor device assembly of claim 1 wherein:
   the sidewall surface faces inwardly toward the stack of second semiconductor dies; and
   the thermal transfer structure includes an inner surface that is generally coplanar with the sidewall surface.

5. The semiconductor device assembly of claim 1 wherein:
   the sidewall surface defines a first sidewall surface that faces the stack of second semiconductor dies and the first semiconductor die further includes a second sidewall surface that extends away from the first sidewall surface at a non-zero angle; and
   the underfill material at least partially covers the first sidewall surface and the second sidewall surface.

6. The semiconductor device assembly of claim 1 wherein:
   the thermal structure includes a first wall portion and a second wall portion that define a recess; and
   at least one of the second semiconductor dies is positioned within the recess.

7. The semiconductor device assembly of claim 1 wherein the first semiconductor die includes a plurality of through-silicon vias extending through the base portion, and the through-silicon vias are electrically coupled to the stack of second semiconductor dies.

8. The semiconductor device assembly of claim 1 wherein the first semiconductor die includes an integrated circuit.

9. The semiconductor device assembly of claim 8 wherein the integrated circuit is located at least partially in the peripheral region.

10. The semiconductor device assembly of claim 8 wherein:
    the integrated circuit is a logic circuit; and
    the second semiconductor dies are memory dies.

11. The semiconductor device assembly of claim 1 wherein the cavity has a depth of at least 200 µm.

12. The semiconductor device assembly of claim 11 wherein the second semiconductor dies each have a thickness in a range of about 50 to about 200 µm.

13. The semiconductor device assembly of claim 1 wherein the cavity has a depth of at least 300 µm.

14. The semiconductor device assembly of claim 1 wherein the stack of second semiconductor dies includes at least two semiconductor dies in the cavity.

15. A semiconductor device assembly, comprising:
    a logic die having a cavity;
    a first memory die in the cavity;
    a thermal transfer structure attached to the logic die;
    a second memory die on the first memory; and
    an underfill material between the first and second memory dies, and at least partially filling the cavity.

16. The semiconductor device assembly of claim 15, further comprising a plurality of through-silicon vias beneath the first memory die and extending through the logic die.

17. The semiconductor device assembly of claim 15 wherein:
    the logic die includes a sidewall surface adjacent the thermal transfer structure and separated from the first memory die by a gap; and
    the underfill material includes a fillet at least in the gap.

18. The semiconductor device assembly of claim 15 wherein the thermal transfer structure is attached to the second memory die.

19. The semiconductor device assembly of claim 15 wherein the thermal transfer structure does not contact the underfill material.

20. The semiconductor device assembly of claim 15 wherein the logic die includes:
    a peripheral region adjacent the cavity and attached to the thermal transfer structure; and
    an integrated circuit component located at least partially in the peripheral region.

21. The semiconductor device assembly of claim 20 wherein the integrated circuit component includes a serial/deserializer circuit.

22. A method of forming a semiconductor device assembly, comprising
    forming a cavity in a semiconductor substrate;
    attaching a stack of semiconductor dies to a recessed surface in the cavity;
    depositing an underfill material between individual semiconductor dies of the stack of semiconductor dies;
    accumulating excess underfill material between the stack of semiconductor dies and a peripheral region of the substrate adjacent the cavity; and
    attaching a thermal transfer structure to the peripheral region.

23. The method of claim 22 wherein depositing the underfill material includes injecting the underfill material between the individual semiconductor dies.

24. The method of claim 22, further comprising attaching the thermal transfer structure to the stack of semiconductor dies.

25. The method of claim 22 wherein forming the cavity includes etching a hole into the substrate to a depth of at least 200 μm.

26. The method of claim 25, further comprising thinning the substrate to a thickness of 300 μm or less.

27. The method of claim 22 wherein forming the cavity includes etching a hole into the substrate to a depth of at least 300 μm.

28. The method of claim 22 wherein:
forming the cavity includes etching a hole in the substrate to expose a plurality of through-silicon vias (TSVs) at a base of the cavity; and
attaching the stack of semiconductor dies includes bonding bond pads of a bottom-most one of the semiconductor dies in the stack to the TSVs.

29. The method of claim 22 wherein the semiconductor substrate includes an integrated circuit.

30. The method of claim 22 wherein attaching the thermal transfer structure includes positioning at least one of the semiconductor dies in a recess of the thermal transfer structure.

31. A method of forming a semiconductor device assembly, comprising:
positioning a stack of memory dies at least partially in a cavity of a logic die;
at least partially filling the cavity with an underfill material;
positioning at least one of the memory dies in a recess of a thermal transfer structure; and
attaching the thermal transfer structure to a peripheral region of the logic die adjacent the cavity.

32. The method of claim 31 wherein at least partially filling the cavity with the underfill material includes flowing excess underfill material into a gap between the stack of memory dies and the peripheral region.

33. The method of claim 31, further comprising electrically coupling the stack of memory dies to a plurality of through-silicon vias at a base of the cavity.

34. The method of claim 31, further comprising attaching the thermal transfer structure to the at least one of the memory dies.

35. The method of claim 31 wherein the logic die includes an integrated circuit component located at least partially in the peripheral region.

36. The method of claim 35 wherein the integrated circuit component includes a serial/deserializer circuit.

* * * * *